United States Patent
Mehr et al.

[11] Patent Number: 6,005,431
[45] Date of Patent: Dec. 21, 1999

[54] HIGH BAND WIDTH, HIGH GAIN OFFSET COMPENSATING AMPLIFIER SYSTEM FOR A READ CHANNEL

[75] Inventors: Iuri Mehr; Paul F. Ferguson, both of North Andover, Mass.

[73] Assignee: Analog Devices, Inc., Norwood, Mass.

[21] Appl. No.: 09/126,489

[22] Filed: Jul. 30, 1998

[51] Int. Cl.$^6$ ..................................................... H03L 5/00
[52] U.S. Cl. ........................................... 327/307; 327/560
[58] Field of Search ..................................... 327/307, 334, 327/560–563, 78, 79, 91, 94, 95; 330/3, 151, 302, 310

[56] References Cited

U.S. PATENT DOCUMENTS

| | | | |
|---|---|---|---|
| 4,514,706 | 4/1985 | Thompson | 331/16 |
| 4,587,443 | 5/1986 | Plassche | 327/95 |
| 5,392,001 | 2/1995 | Uhling et al. | 330/156 |
| 5,508,656 | 4/1996 | Jaffard et al. | 330/9 |
| 5,648,738 | 7/1997 | Welland et al. | 327/307 |

*Primary Examiner*—Toan Tran
*Attorney, Agent, or Firm*—Iandiorio & Teska

[57] ABSTRACT

A method and system for high bandwidth, high gain offset compensation in a read channel integrated circuit includes zeroing the analog read signal applied to the signal path at a first location in the read channel integrated circuit path prior to a first amplifier which has a first gain and a first bandwidth magnitude characteristic with a high frequency boost; coupling a signal from the first amplifier to a second amplifier which has a second gain larger than the first and a second bandwidth magnitude characteristic having high frequency roll-off; and further coupling the signal further from the second amplifier to a storage device and feeding back the signal stored in the storage device to the first amplifier to apply the high frequency boost of the first bandwidth magnitude characteristic to compensate for the high frequency roll-off of the second bandwidth magnitude characteristic; decoupling the signal from the storage device and removing the zeroing of the analog read signal applied to the signal path.

18 Claims, 5 Drawing Sheets

HIGH BAND WIDTH, HIGH GAIN OFFSET COMPENSATING AMPLIFIER SYSTEM FOR A READ CHANNEL

FIELD OF INVENTION

This invention relates to an improved read channel amplitude circuit amplifier system which provides higher gain and bandwidth while also providing offset error compensation.

BACKGROUND OF INVENTION

In conventional read channel integrated circuits offsets caused by the elements of the read channel integrated circuits introduce errors into the signal. To offset these errors autozeroing techniques have been used which zero the analog read signal applied to the signal path at a first location in the read channel so that the signal in the path is now the undesired offset. Then a signal at a location downstream from the first location is fed to a storage device which is coupled to a point between the first and second locations to cancel the offset. The storage device is then decoupled from the second location and the zeroing of the read signal is ended. Such devices are disclosed in U.S. Pat. Nos. 5,648,738 (disc drives) and 5,508,656 (tape drives).

Separately, another problem is that in such read channels the input to the analog to digital converter (ADC) is preferably large but the output from the preceding filter is typically small. If the output was made larger such as by a prior amplification then the filter output would contain more distortion. Placing an amplifier between the filter and ADC adds another set of problems. If that amplifier introduces substantial amplification then the bandwidth will be narrowed and harmonic distortion will be increased. If the gain is decreased then bandwidth can be broader and harmonic distortion lower but the signal to noise ratio will be poorer at the input of the ADC.

One approach is to simply place a capacitor in series between the filter and ADC but that capacitor must be very large in order to block the d.c. offset yet pass the high frequency signal. Such a capacitor would be too large for implementation in an integrated circuit chip.

SUMMARY OF INVENTION

It is therefore an object of this invention to provide an improved read channel integrated circuit amplifier system.

It is a further object of this invention to provide such an improved read channel integrated circuit amplifier system which provides both higher gain and broader bandwidth while also providing offset error compensation.

It is a further object of this invention to provide such an improved read channel integrated circuit amplifier system which provides high gain, broad bandwidth, low harmonic distortion and high signal to noise ratio.

It is a further object of this invention to provide such an improved read channel integrated circuit amplifier system which is wholly implementable in an integrated circuit chip.

The invention results from the realization that a truly effective amplifier system for a read channel integrated circuit which not only provides automatic zeroing offset compensation but also provides high gain, broad bandwidth, high signal to noise ratio and low harmonic distortion can be achieved by splitting the tasks between two amplifiers one of which provides high gain but suffers from high frequency roll-off, the other of which provides low gain but has a high frequency boost to compensate for the roll-off so that the overall gain is high enough to serve the ADC over a large bandwidth and the individual gains are small enough to reduce harmonic distortion. With the system zeroed, the output of the second amplifier can be stored and fed back to the first amplifier to compensate for the offset error. The insertion point of the compensation signal can be chosen to reduce distortion in the first amplifier and minimize noise caused by the compensation circuitry.

This invention features high bandwidth, high gain offset compensation in a read channel amplifier system for a read channel integrated circuit including a first amplifier having a first gain and a first bandwidth magnitude characteristic and a second amplifier having a second gain greater than the first amplifier and having a second bandwidth magnitude characteristic with frequency roll-off. There is a storage means and a feedback circuit for coupling the output of the second amplifier to the storage means as a feedback signal. There are means for decoupling the feedback signal from the first amplifier. The first bandwidth has a magnitude characteristic which compensates for the frequency roll-off of the second bandwidth characteristic so that the combined bandwidth magnitude characteristic is broader than that of the second bandwidth alone.

In a preferred embodiment the first amplifier may include a buffer amplifier, a first transconductance amplifier responsive to the buffer amplifier and a second unity gain feedback transconductance amplifier responsive to the first transconductance amplifier. The second amplifier may include a transconductance voltage to current converter amplifier, a current amplifier responsive to the transconductance amplifier and a transresistance current to voltage converter amplifier responsive to the current amplifier. The buffer amplifier may include means for providing a high-frequency boost of the bandwidth magnitude characteristic of the first amplifier. The transconductance resistance of the transconductance voltage to current converter amplifier and the transresistance of the transresistance current to voltage converter amplifier may be approximately equal. The buffer amplifier may include a current mirror having a current aspect ratio that defines a gain which generates a compensating increase in amplitude at higher frequencies for compensating for the high frequency roll-off of the second amplifier. The feedback circuit may include an amplifier, the means for decoupling may include a switch and the storage means may include an integrating storage means such as a capacitor.

The invention also features in a high bandwidth, high gain read channel integrated circuit having a signal path for receiving and processing an analog read signal from a storage device, a method of reducing offsets caused by elements of the read channel integrated circuit including the steps of zeroing the analog read signal applied to the signal path at a first location in the read channel integrated circuit path prior to a first amplifier which has a first gain and first bandwidth magnitude characteristic with a high frequency boost. The signal is coupled from the first amplifier to a second amplifier which has a second gain larger than the first and a second bandwidth magnitude characteristic having high frequency roll-off and the signal is coupled from the second amplifier to the storage device. The signal stored in the storage device is fed back to the first amplifier to compensate for the offset error. The high frequency boost of the first bandwidth magnitude characteristic is applied to compensate for the high frequency roll-off of the second bandwidth magnitude characteristic. The signal may then be decoupled from the storage device and the zeroing of the analog read signal may be removed.

In a preferred embodiment the first amplifier may include a buffer amplifier, a first transconductance amplifier responsive to the buffer amplifier, and a second unity gain feedback transconductance amplifier responsive to the first transconductance amplifier. The second amplifier may include a transconductance voltage to current converter amplifier, a current amplifier responsive to the transconductance amplifier, and a transresistance current to voltage converter amplifier responsive to the current amplifier. The buffer amplifier may include means for providing a high frequency boost to the bandwidth magnitude characteristic of the first amplifier. The transconductance resistance of the transconductance voltage to current converter amplifier and the transresistance of the transresistance current to voltage converter amplifier may be approximately equal. The buffer amplifier may include a current mirror having a current aspect ratio that defines a gain which generates a compensating increase in amplitude at higher frequencies for compensating for the high frequency roll-off of the second amplifier. The feedback circuit may include an amplifier, the means for decoupling may include a switch and the storage means may include an integrating device such as a capacitor.

DISCLOSURE OF PREFERRED EMBODIMENT

Other objects, features and advantages will occur to those skilled in the art from the following description of a preferred embodiment and the accompanying drawings, in which.

Figure 1:
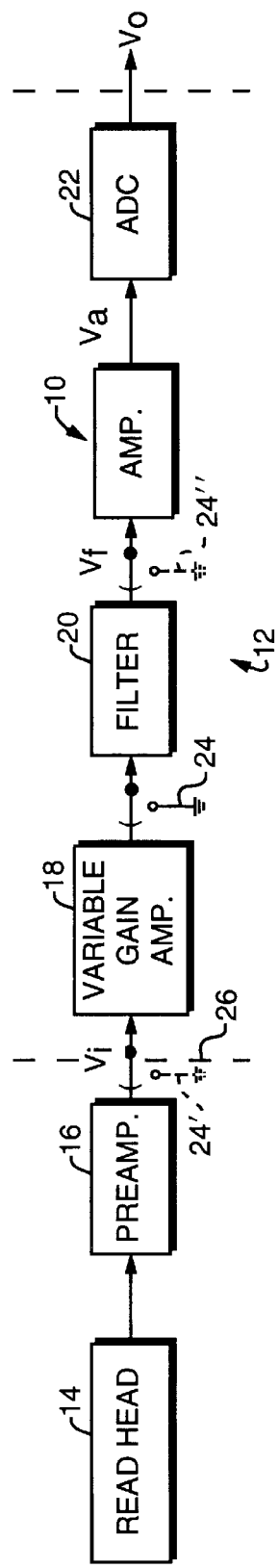
FIG. 1 is a schematic block diagram of an amplifier system according to this invention in a read channel integrated circuit connected to a disc drive read head.

There is shown in FIG. 1 a high bandwidth, high gain offset compensating amplifier system 10 in a read channel integrated circuit having an input $V_i$ delivered by read head 14 through preamplifier 16. Read channel 12 includes a variable gain amplifier 18, filter 20, and an analog to digital converter 22. Amplifier system 10 according to this invention receives an input voltage $V_f$ from filter 20 and provides an output voltage $V_a$, and in doing so performs two separate important functions. First, it amplifies the output $V_f$ of filter 20 sufficiently to provide an adequate input $V_a$ to ADC 22 and in doing so it avoids the usual problems accompanying high gain such as high harmonic distortion and narrow bandwidth. Second it provides the means whereby offset error may be compensated by automatically zeroing the read channel such as by grounding switch 24 preceding filter 20, or at 24' or 24" or anywhere else in the channel preceding amplifier system 10. When switch 24 autozeroes read channel 12, the only signal moving through the channel will be the offset error signal. Amplifier 10 detects and feeds back that signal to compensate for that offset error. The entire read channel 12 including amplifiers 18 and 10, filter 20 and ADC 22, are implemented in CMOS on integrated circuit chip 26. Although amplifier 18 could be made to provide adequate gain, filter 20 would then have to operate at a higher signal level which would cause distortion; thus the desirability of interposing amplifier system 10 according to this invention.

Figure 2:
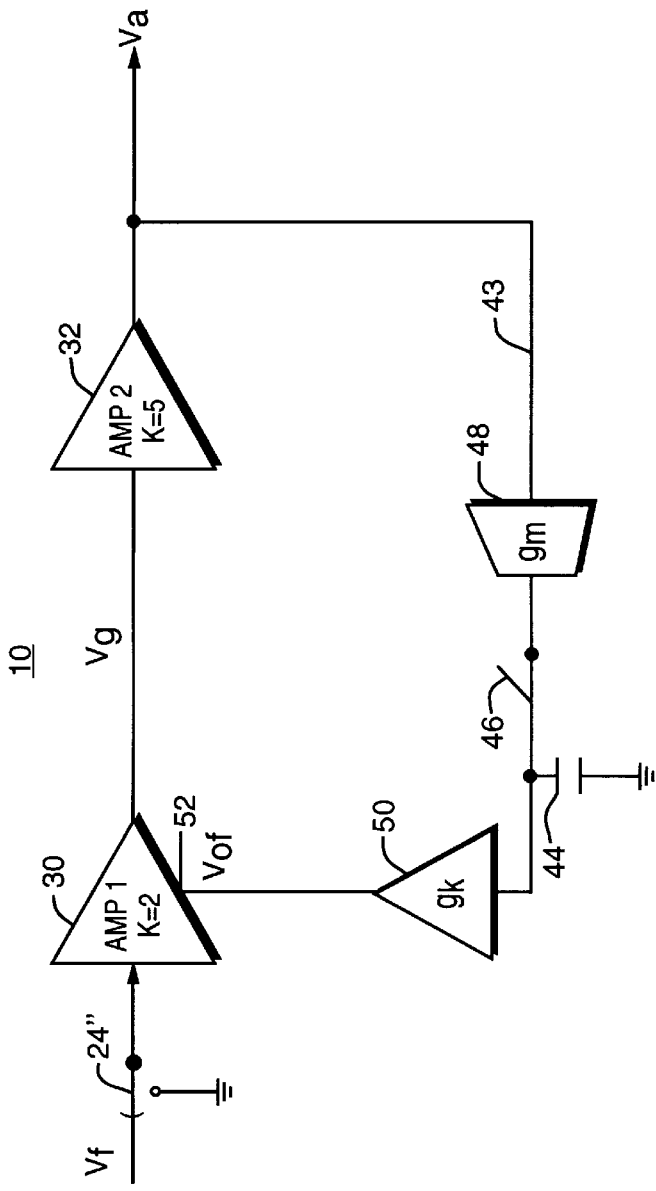
FIG. 2 is a more detailed schematic diagram of one embodiment of the amplifier system of FIG. 1.
Figure 2A:
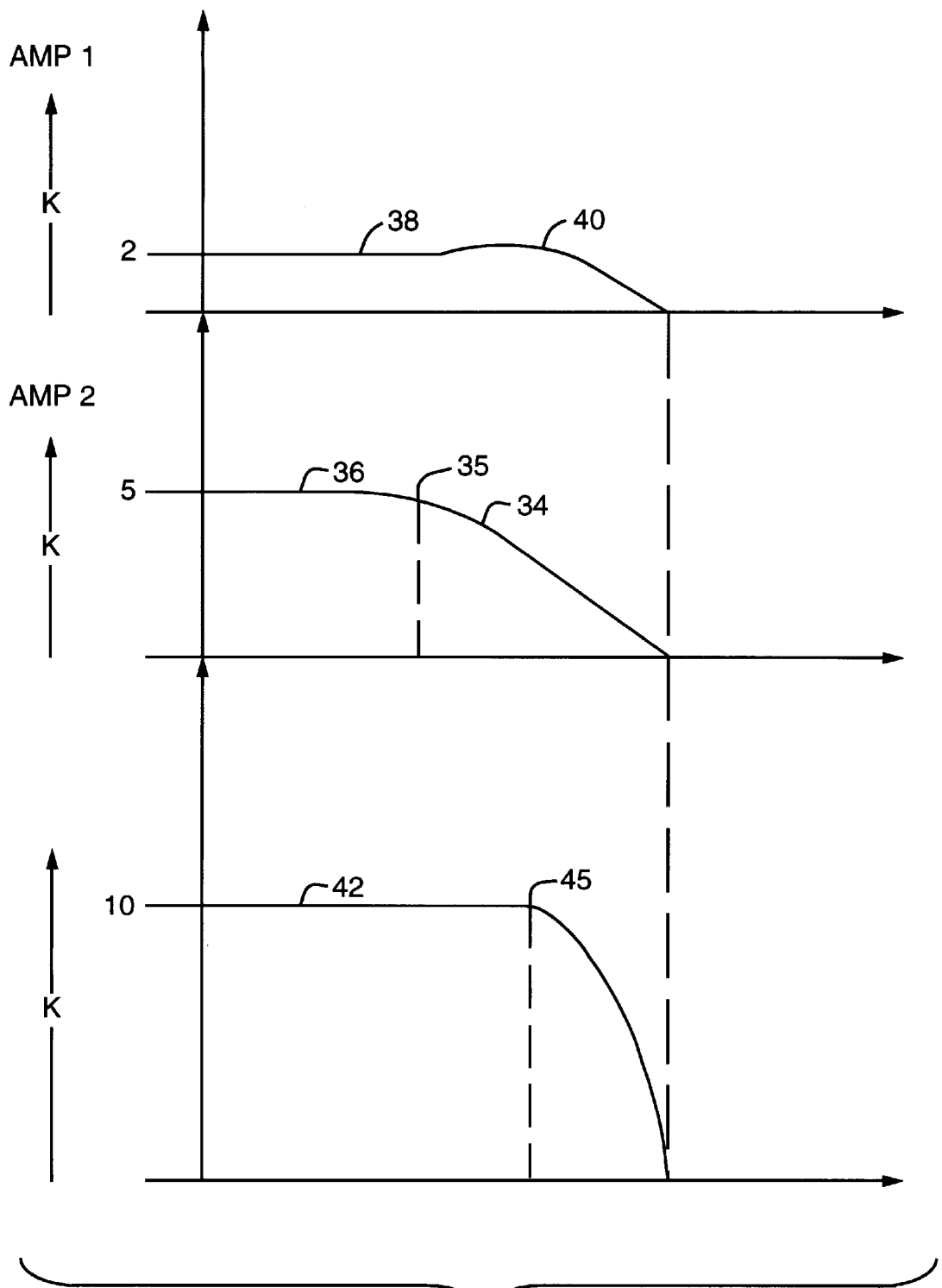
FIG. 2A illustrates the magnitude characterization of each of the amplifiers and the combined output of the amplifier system of FIG. 2.

Amplifier system 10 in one embodiment, FIG. 2, splits the amplifier system into two separate amplifiers, amplifier I, 30 and amplifier II, 32. Thus each of the amplifiers may have a lower gain, for example amplifier 30 has a gain of two and amplifier 32 has a gain of five, giving an overall gain output at voltage $V_a$ of ten. However, in obtaining this gain of 10 neither amplifier had a gain large enough to cause serious harmonic distortion but the signal to noise ratio is still tolerable. Further, although the higher gain amplifier 32 will result in a narrower bandwith because of high frequency roll-off 34 depicted in its magnitude characteristic 36, FIG. 2A, the lower gain amplifier 30 can be made to have a broad bandwidth as indicated by its magnitude characteristic 38 with a high frequency boost 40 which compensates for roll-off 34 to provide an overall higher gain and broader bandwidth magnitude characteristic 42 at the output $V_a$.

To effect error offset compensation the output from amplifier 32 in the autozero mode when the input to amplifier 30 is grounded, is fed back over line 43 to a storage device such as an integrating storage capacitor 44. The stored signal is then fed back to amplifier 30 at $V_{of}$ to just compensate for the offset error. After this has been done the input on feedback line 43 may be decoupled by switch 46 from the storage device 44. Transconductance amplifier 48 may be provided to enhance the feedback signal and another transconductance amplifier 50 may be used to enhance the signal delivered from capacitor 44 to amplifier 30. In addition the output of amplifier 50 can be a high impedance output which further enhances operation by being delivered to a low impedance node 52 in amplifier 30 which reduces the noise contribution from amplifier 50. Node 52 is chosen such that most of the circuitry inside amplifier 30 is operated at very low offset (already compensated) thus minimizing harmonic distortion. Capacitor 44 may be chosen in the range of one picofarad. If the capacitor were made much larger it would respond too slowly; if it were too small the noise could become a serious problem and it should be implementable in a CMOS integrated circuit technology.

Figure 3:
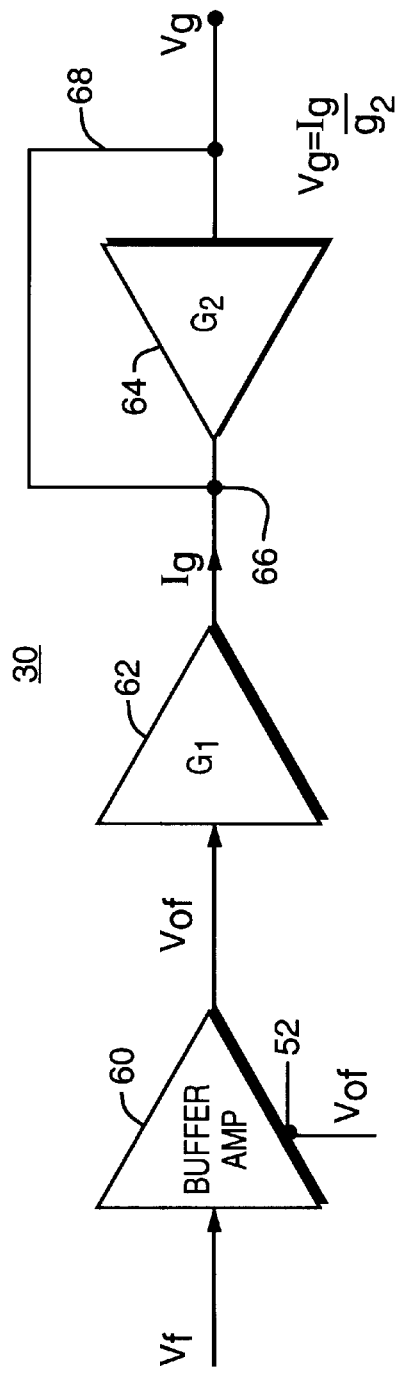
FIG. 3 is a more detailed schematic diagram of the first amplifier in FIG. 2.
Figure 4:
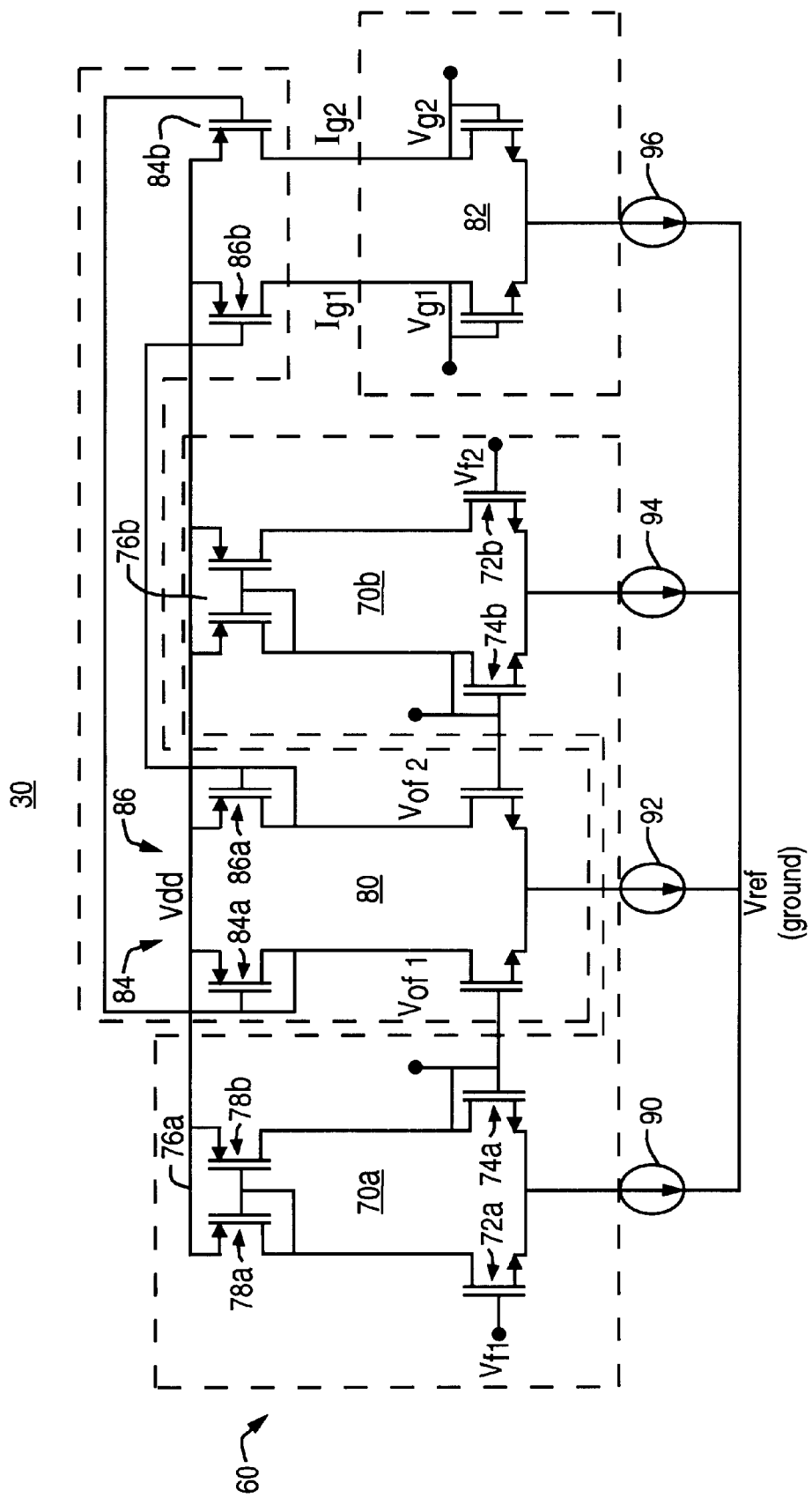
FIG. 4 is a more detailed schematic circuit diagram of the amplifier of FIG. 3.

Amplifier I, 30, FIG. 3, may be comprised of three amplifiers, buffer amplifier 60 and transconductance amplifiers $G_1$ 62 and $G_2$ 64. Buffer amplifier 60 receives the input $V_f$ and contains the low impedance node 52. Its output $V_{of}$ is delivered to the first transconductance amplifier 62 whose output current $I_g$ flows to node 66. Also connected to this node is the output of transconductance amplifier 62 and feedback loop 68. Thus the output voltage $V_g$ is equal to the current $I_g$ divided by the transconductance of amplifier 64. Amplifier 30 can be implemented in CMOS technology as shown in FIG. 4 where each of the signals $V_f$, $V_{of}$, $I_g$ and $V_g$ have two counterparts since the entire amplifier is implemented in the differential mode. Thus there are two input signals $V_{f1}$, $V_{f2}$, two feedback signals $V_{of1}$, $V_{of2}$, two currents $I_{g1}$, $I_{g2}$, and two output voltages $V_{g1}$, $V_{g2}$. Buffer amplifier 60 includes two stages 70a and 70b each of which includes a source follower 72a, 72b receiving the input signals $V_{f1}$ and $V_{f2}$, respectively, and a diode connected transistor 74a, 74b each of which is connected with a current mirror 76a, 76b. The two transistors 78a, 78b of current mirror 76a are constructed with a current aspect ratio that defines a gain which generates a compensating increase at higher frequencies shown as the high frequency boost 40, FIG. 2A, which compensates for the frequency roll-off 34, FIG. 2A, of the second amplifier. For example, if this aspect ratio is four and the gain obtained is four the boosted frequency region 40, FIG. 2A, has a maximum gain (at the top of "boost") of 2.4 larger than the normal dc gain of 2 at a frequency a little higher than the cutoff frequency of amplifier II, 32 region 34. The resulting transfer function 42 has a normal gain of ten and a cutoff frequency 45 higher than the cutoff frequency 35 of the second amplifier alone. Amplifier 30 also includes a transconductance amplifier 80 and a transconductance amplifier 82 with unity feedback. These two transconductance amplifiers 80 and 82 are linked by two current mirrors 84 and 86 consisting of transistors 84a and 84b and transistors 86a and 86b. Also included are four bias current sources 90, 92, 94 and 96.

Figure 5:
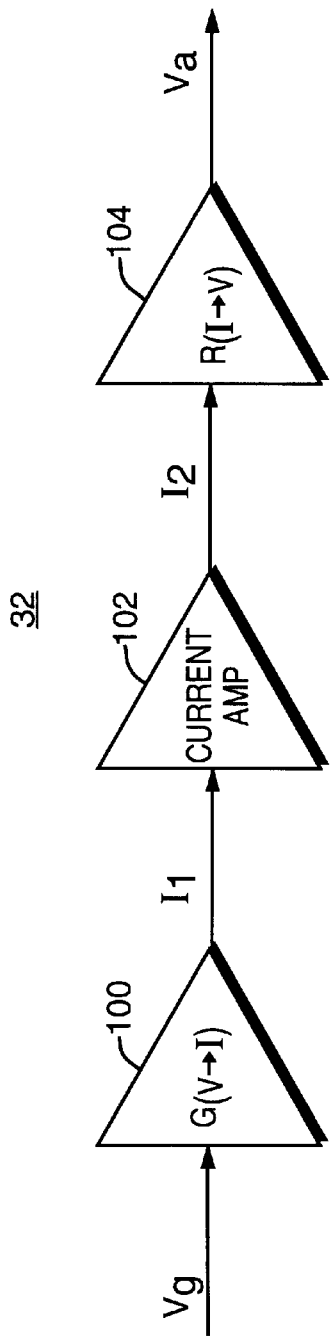
FIG. 5 is a more detailed schematic diagram of the second ampifier in FIG. 2.

Amplifier 32, FIG. 5, includes transconductance amplifier 100, current amplifier 102 and transresistance amplifier 104. The output signal $V_g$ from amplifier 30 is delivered to transconductance amplifier 100 which converts that voltage to current $I_1$. The current $I_1$ is amplified in current amplifier 102 to produce current $I_2$ which in transresistance amplifier 104 is converted back to voltage $V_a$.

Figure 6:
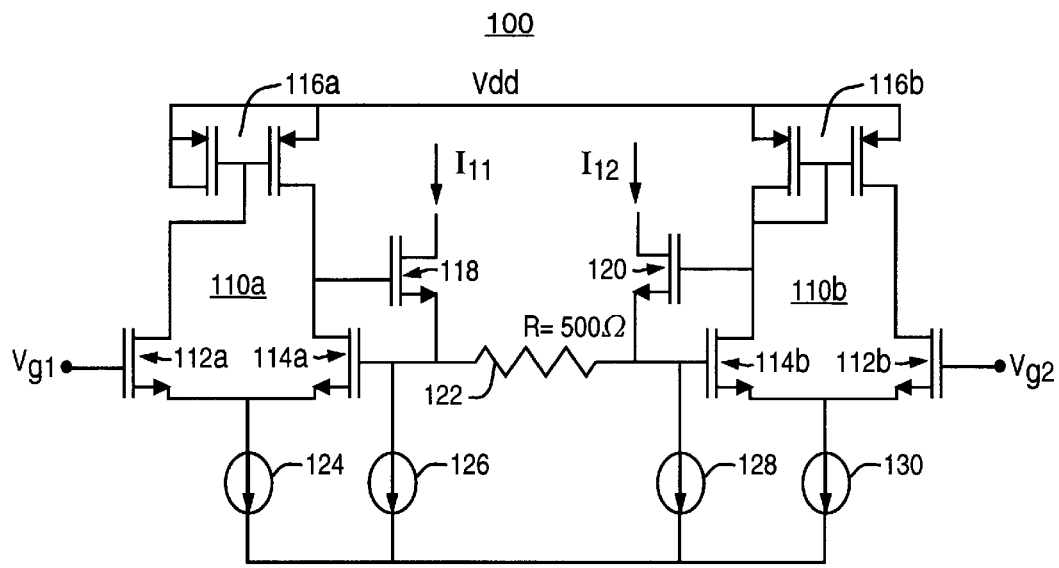
FIG. 6 is a more detailed schematic circuit diagram of the transconductance amplifier of FIG. 5.
Figure 7:
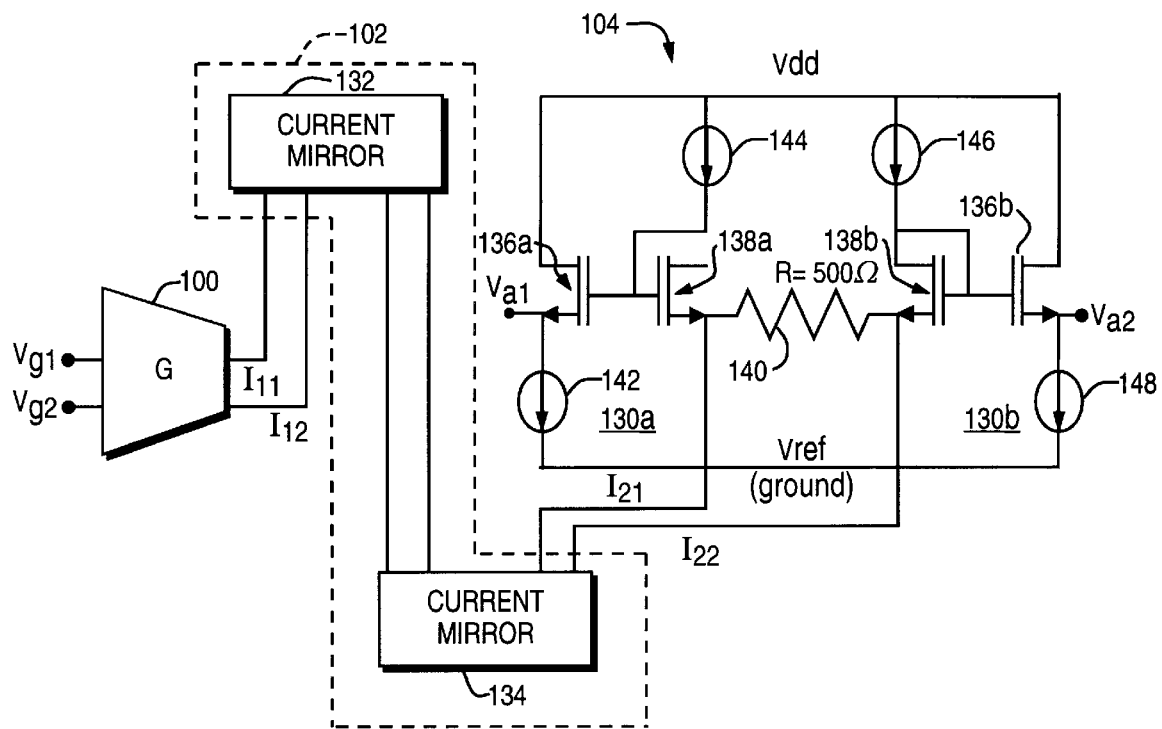
FIG. 7 is a more detailed schematic circuit diagram of the transresistance amplfier and current amplifier of FIG. 5.

Amplifier 100, FIG. 6, includes two buffer stages 110a, 110b, each of which contains a source follower transistor 112a, 112b that receives the input, and a second transistor 114a, 114b. Both transistors have their drains interconnected with current mirrors 116a, 116b. A pair of source followers 118, 120 are provided with their sources connected across impedance 122 which is typically a resistance and may be, for example, in the range of 500 Ω. Four bias current sources 124, 126, 128 and 130 are also included. Current amplifier 102 may include two current mirror amplifiers 132 and 134, FIG. 7. which generate the entire gain of five. Transresistance amplifier 104 is shown including two stages 130a and 130b each of which includes a source follower transistor 136a, 136b providing outputs $V_{a1}$ and $V_{a2}$, respectively, and diode connected transistors 138a, 138b. The sources of transistors 138 and 138b are interconnected through an impedance 140 which may be a resistance typically having a value of 500 Ω. Impedances 122 in FIG. 6 and 140 in FIG. 7 may be fabricated in any suitable way and as any kind of impedance but resistance is chosen here because it is more linear. Further, the values of R 122 and R 140 are chosen to be equal and relatively small so that they do not degrade the frequency response. If they were not equal, for example, if resistance 122 were less than resistance 140, then additional gain could be obtained at the expense of larger harmonic distortion due to a large current 5 $I_1$. Amplifier 104 also includes four bias current sources 142, 144, 146 and 148.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A high bandwidth, high gain offset compensating amplifier system for a read channel integrated circuit, comprising:

a first amplifier having a first gain and a first bandwidth magnitude characteristic with high frequency boost;

a second amplifier, coupled to the first amplifier, having a second gain greater than said first amplifier and having a second bandwidth magnitude characteristic with high frequency roll-off;

storage device;

a feedback circuit for coupling said storage device between an output of said second amplifier and said first amplifier for compensating for an offset error; and means for decoupling the feedback signal from the first amplifier; said first bandwidth having a magnitude characteristic with high frequency boost which compensates for the high frequency roll off of the second bandwidth magnitude characteristic so that the combined bandwidth magnitude characteristic is broader than that of the second amplifier alone.

2. The offset compensating system of claim 1 in which said first amplifier includes a buffer amplifier, a first transconductance amplifier responsive to said buffer amplifier and a second unity gain feedback transconductance amplifier responsive to said first transconductance amplifier.

3. The offset compensating system of claim 1 in which said second amplifier includes a transconductance voltage to current converter amplifier, a current amplifier responsive to said transconductance amplifier, and a transresistance current to voltage converter amplifier responsive to said current amplifier.

4. The offset compensating system of claim 2 in which said buffer amplifier includes means for providing a high frequency boost to said bandwidth magnitude characteristic of said first amplifier.

5. The offset compensating system of claim 3 in which the transconductance resistance of said transconductance voltage to current converted amplifier and the transresistance of said transresistance current to voltage converter amplifier are approximately equal.

6. The offset compensating system of claim 4 in which said buffer amplifier includes a current mirror having a current aspect ratio that defines a gain which generates a compensating increase in amplitude at higher frequencies for compensating for the frequency roll off of the second amplifier.

7. The offset compensating system of claim 4 in which said feedback circuit includes an amplifier.

8. The offset compensating system of claim 1 in which said means for decoupling includes a switch.

9. The offset compensating system of claim 1 in which said storage device includes a capacitor.

10. In a read channel integrated circuit having a signal path for receiving and processing an analog read signal, a method of reducing offsets caused by elements of the read channel integrated circuit while preserving high bandwidth and high gain comprising:

zeroing the analog read signal applied to the signal path at a first location in the read channel integrated circuit path prior to a first amplifier which has a first gain and first bandwidth magnitude characteristic with a high frequency boost;

coupling a signal from the first amplifier to the second amplifier which has a second gain larger than the first and a second bandwidth magnitude characteristic having high frequency roll-off and from the second amplifier to a storage device and feeding back the signal stored in the storage device to the first amplifier to apply the high frequency boost of the first bandwidth magnitude characteristic to compensate for the high frequency roll-off of the second bandwidth magnitude characteristic and to compensate for the offset error;

decoupling the signal from the storage device; and removing the zeroing of the analog read signal applied to the signal path.

11. The method of claim 10 in which said first amplifier includes a buffer amplifier, a first transconductance amplifier responsive to said buffer amplifier and a second unity gain feedback transconductance amplifier responsive to said first transconductance amplifier.

12. The method of claim 10 in which said second amplifier includes a transconductance voltage to current converter amplifier, a current amplifier responsive to said transconductance amplifier, and a transresistance current to voltage converter amplifier responsive to said current amplifier.

13. The method of claim 11 in which said buffer amplifier includes means for providing a high frequency boost to said bandwidth magnitude characteristic of said first amplifier.

14. The method of claim 12 in which the transconductance resistance of said transconductance voltage to current converter amplifier and the transresistance of said transresistance current to voltage converter amplifier are approximately equal.

15. The method of claim 13 in which said buffer amplifier includes a current mirror having a current aspect ratio that defines a gain which generates a compensating increase in amplitude at higher frequencies for compensating for the frequency roll off of the second amplifier.

16. The method of claim 10 in which said feedback circuit includes an amplifier.

17. The method of claim 10 in which said means for decoupling includes a switch.

18. The method of claim 10 in which said storage means includes a capacitor.

* * * * *